(12) United States Patent
Lin et al.

(10) Patent No.: US 11,848,314 B2
(45) Date of Patent: Dec. 19, 2023

(54) MICRO LIGHT-EMITTING DIODE DISPLAY MATRIX MODULE

(71) Applicant: PlayNitride Display Co., Ltd., MiaoLi County (TW)

(72) Inventors: Wei-Ping Lin, MiaoLi County (TW); Chun-Ming Tseng, MiaoLi County (TW); Po-Jen Su, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 374 days.

(21) Appl. No.: 17/228,688

(22) Filed: Apr. 12, 2021

(65) Prior Publication Data

US 2022/0059511 A1 Feb. 24, 2022

Related U.S. Application Data

(60) Provisional application No. 63/069,693, filed on Aug. 24, 2020.

(30) Foreign Application Priority Data

Dec. 3, 2020 (TW) .................................. 109142526

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01)

(58) Field of Classification Search
CPC ........ H01L 25/0753; H01L 33/62; G09G 3/32
See application file for complete search history.

(56) References Cited

U.S. PATENT DOCUMENTS

2006/0033114 A1* 2/2006 Schranz ............ H01L 27/14678
257/E27.134
2018/0012873 A1 1/2018 Lee et al.
(Continued)

FOREIGN PATENT DOCUMENTS

CN 109216525 1/2019
CN 109378370 2/2019
(Continued)

OTHER PUBLICATIONS

"Office Action of Taiwan Counterpart Application", dated Sep. 7, 2021, p. 1-p. 4.
(Continued)

*Primary Examiner* — Andrew J Coughlin
(74) *Attorney, Agent, or Firm* — JCIPRNET (57) ABSTRACT

The micro light-emitting diode (LED) display matrix module of the disclosure includes a multilayer circuit layer, multiple micro LEDs, and an insulating flat layer. The multilayer circuit layer includes a top circuit layer and a bottom circuit layer. The bottom circuit layer includes multiple pads. The micro LEDs are disposed on the top circuit layer of the multilayer circuit layer and define multiple light-emitting units. Each of the light-emitting units includes three of the micro LEDs that are separated from each other. The light-emitting units are arranged in a matrix of m columns and n rows to define multiple pixel regions, and quantity of the pads is equal to 3m+n. An orthographic projection of each of the micro LEDs on the bottom circuit layer completely overlaps the corresponding pad. The insulating flat layer covers the top circuit layer of the multilayer circuit layer and the micro LEDs.

20 Claims, 5 Drawing Sheets

(56) References Cited

U.S. PATENT DOCUMENTS

| | | | | |
|---|---|---|---|---|
| 2018/0103513 A1* | 4/2018 | Tseng | ................ | H01L 25/0753 |
| 2018/0342490 A1* | 11/2018 | Biwa | .................. | H01L 25/0753 |
| 2019/0012956 A1* | 1/2019 | Li | ............................ | G09G 3/32 |
| 2019/0371777 A1 | 12/2019 | Iguchi | | |
| 2019/0385987 A1* | 12/2019 | Kong | ..................... | H01L 24/48 |
| 2020/0312819 A1* | 10/2020 | Shao | ...................... | H01L 25/13 |

FOREIGN PATENT DOCUMENTS

| | | |
|---|---|---|
| CN | 110233200 | 9/2019 |
| CN | 111540764 | 8/2020 |
| TW | I602306 | 10/2017 |
| TW | 201803128 | 1/2018 |
| TW | I635470 | 9/2018 |

OTHER PUBLICATIONS

"Office Action of China Counterpart Application", dated Jul. 27, 2022, p. 1-p. 6.

* cited by examiner

MICRO LIGHT-EMITTING DIODE DISPLAY MATRIX MODULE

CROSS-REFERENCE TO RELATED APPLICATION

This application claims the priority benefit of U.S. provisional application Ser. No. 63/069,693, filed on Aug. 24, 2020, and Taiwan application serial no. 109142526, filed on Dec. 3, 2020. The entirety of each of the above-mentioned patent applications is hereby incorporated by reference herein and made a part of this specification.

BACKGROUND

Technical Field

This disclosure relates to a display module, and in particular to a micro light-emitting diode (LED) display matrix module.

Description of Related Art

Currently, splicing of a display screen involves encapsulating the red LEDs, green LEDs and blue LEDs one by one, and then mounting them one by one onto a driving circuit board. Therefore, the size and spacing are limited, and as each of the LEDs needs two pads, the quantity of the pads cannot be effectively reduced, thereby affecting the bonding yield. In recent years, an encapsulation of micro LEDs matched with an integrated circuit (IC) has also been proposed, but the thickness is still not reduced and the bonding process is still time-consuming and irreparable.

SUMMARY

This disclosure provides a micro light-emitting diode (LED) display matrix module which effectively reduce the quantity of the pads and is provided with good surface flatness, therefore to improve the process yield for being bonded to a display circuit board.

The micro LED display matrix module of the disclosure includes a multilayer circuit layer, a plurality of micro LEDs, and an insulating flat layer. The multilayer circuit layer includes a top circuit layer and a bottom circuit layer. The bottom circuit layer includes a plurality of pads. The micro LEDs are disposed on the top circuit layer of the multilayer circuit layer and define a plurality of light-emitting units. Each of the light-emitting units includes three of the micro LEDs that are separated from each other. The light-emitting units are arranged in a matrix of m columns and n rows to define a plurality of pixel regions, and quantity of the pads is equal to 3m+n. An orthographic projection of each of the pads completely overlaps the corresponding micro LEDs on the bottom circuit layer. The insulating flat layer covers the top circuit layer of the multilayer circuit layer and the micro LEDs.

In an embodiment of the disclosure, the multilayer circuit layer further includes at least one internal circuit layer and a plurality of dielectric layers. The internal circuit layer is located between the top circuit layer and the bottom circuit layer. The dielectric layers are located between the top circuit layer, the internal circuit layer, and the bottom circuit layer.

In an embodiment of the disclosure, a thickness of the top circuit layer is less than a thickness of the internal circuit layer and a thickness of the bottom circuit layer.

In an embodiment of the disclosure, a circuit pattern density in the internal circuit layer is greater than a circuit pattern density in the top circuit layer, and the circuit pattern density in the top circuit layer is greater than a circuit pattern density in the bottom circuit layer.

In an embodiment of the disclosure, the multilayer circuit layer further includes a plurality of conductive vias, and the top circuit layer, the internal circuit layer, and the bottom circuit layer are electrically connected through the conductive vias.

In an embodiment of the disclosure, orthographic projections of the conductive vias on the bottom circuit layer do not overlap the orthographic projections of the micro LEDs on the bottom circuit layer.

In an embodiment of the disclosure, the internal circuit layer includes a plurality of circuit patterns, and an orthographic projection of each of the light-emitting units on the bottom circuit layer completely overlaps the corresponding circuit patterns.

In an embodiment of the disclosure, the Young's modulus of the insulating flat layer is between 10 GPa and 50 GPa.

In an embodiment of the disclosure, a thickness of the insulating flat layer is at least 5 times greater than a thickness of the multilayer circuit layer.

In an embodiment of the disclosure, the micro LED display matrix module further includes a hard substrate disposed on the insulating flat layer. The insulating flat layer is located between the hard substrate and the multilayer circuit layer.

In an embodiment of the disclosure, a thickness of the hard substrate is greater than a thickness of the insulating flat layer.

In an embodiment of the disclosure, the micro LED display matrix module further includes an insulation layer, which is disposed on a side of the bottom circuit layer opposite to the internal circuit layer and exposes a part of the pads.

In an embodiment of the disclosure, the insulation layer covers a part of a top surface of the pads.

In an embodiment of the disclosure, a thickness of the insulation layer is greater than a thickness of the bottom circuit layer.

In an embodiment of the disclosure, the micro LED display matrix module further includes a surface treatment layer disposed on the part of the top surface of the pads exposed by the insulation layer.

In an embodiment of the disclosure, a material of the surface treatment layer includes electroless nickel immersion gold (ENIG).

In an embodiment of the disclosure, the micro LED display matrix module further includes a light blocking layer, which is disposed on the top circuit layer of the multilayer circuit layer, and includes a plurality of blocking portions. The blocking portions and the light-emitting units are in an alternate arrangement.

In an embodiment of the disclosure, a thickness of the light blocking layer is greater than a thickness of each of the micro LEDs.

In an embodiment of the disclosure, the above-mentioned $m>2$, and $n>2$.

In an embodiment of the disclosure, each of the light-emitting units further includes at least one repair micro LED. The orthographic projection of each of the pads completely overlaps the corresponding repair micro LED on the bottom circuit layer.

Based on the above, in the design of the micro LED display matrix module of the disclosure, the light-emitting unit composed of every three micro light-emitting diodes may be arranged in the matrix of m columns and n rows to define the plurality of pixels region, and the quantity of the pads is equal to 3m+n. The orthographic projection of each of the pads completely overlaps the corresponding light-emitting unit on the bottom circuit layer. In this way, the quantity of the pads can be effectively reduced, and therefore the micro LED display matrix module is with more better surface flatness to improve the process yield for being bonded to the display circuit board.

To make the above-mentioned features and advantages more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
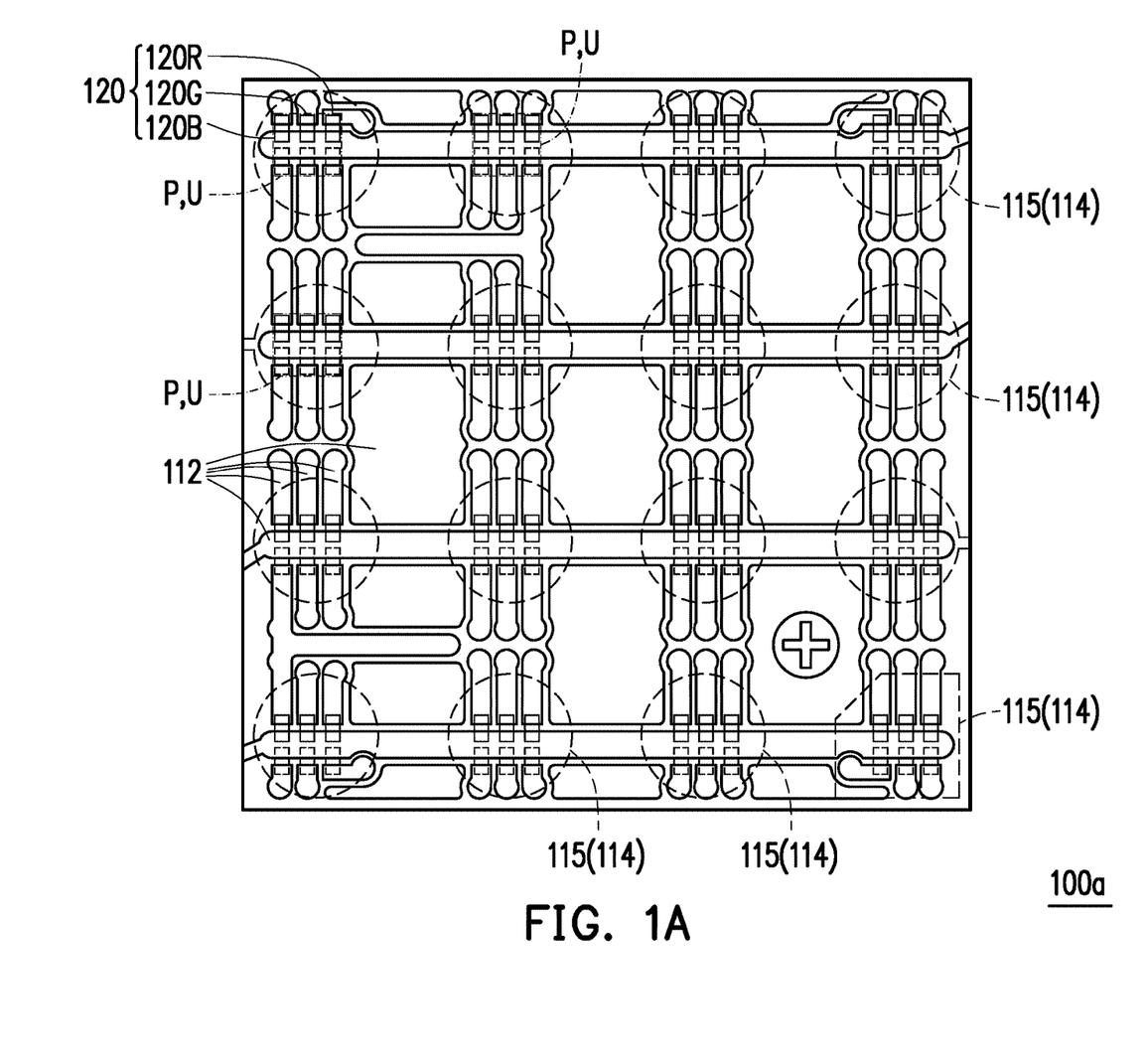
FIG. 1A is a top perspective schematic view of a micro light-emitting diode (LED) display matrix module according to an embodiment of the disclosure.
Figure 1B:
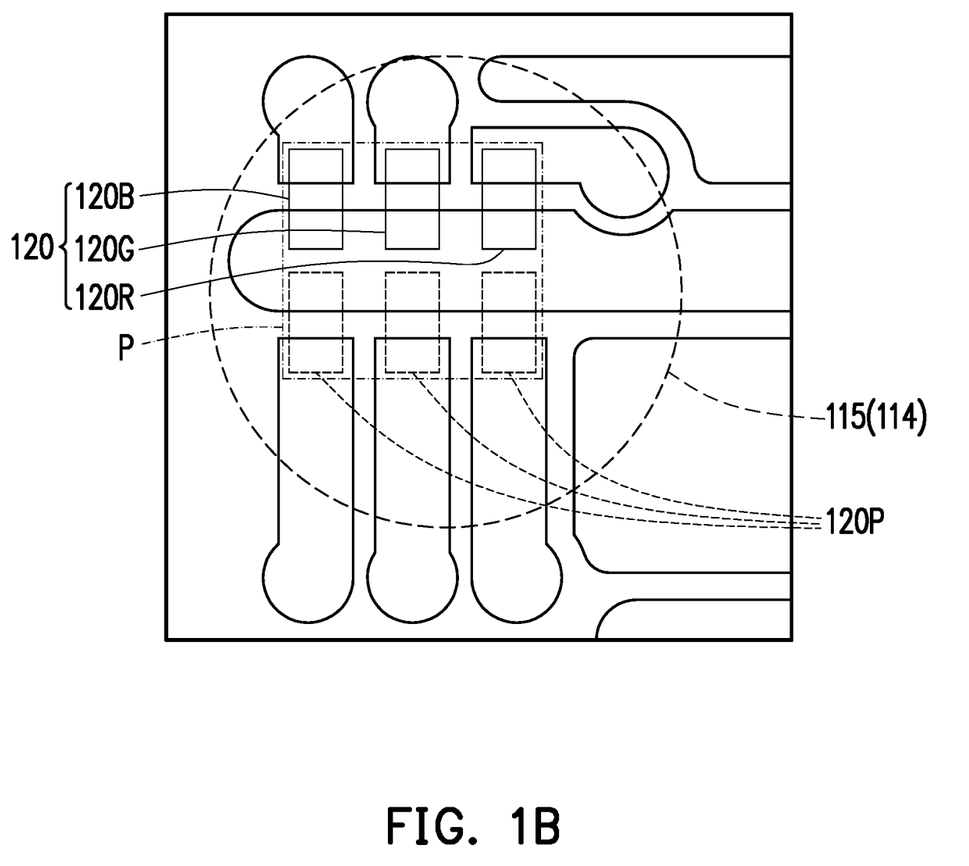
FIG. 1B is an enlarged schematic view of a pixel region of the micro LED display matrix module in FIG. 1A.
Figure 1C:
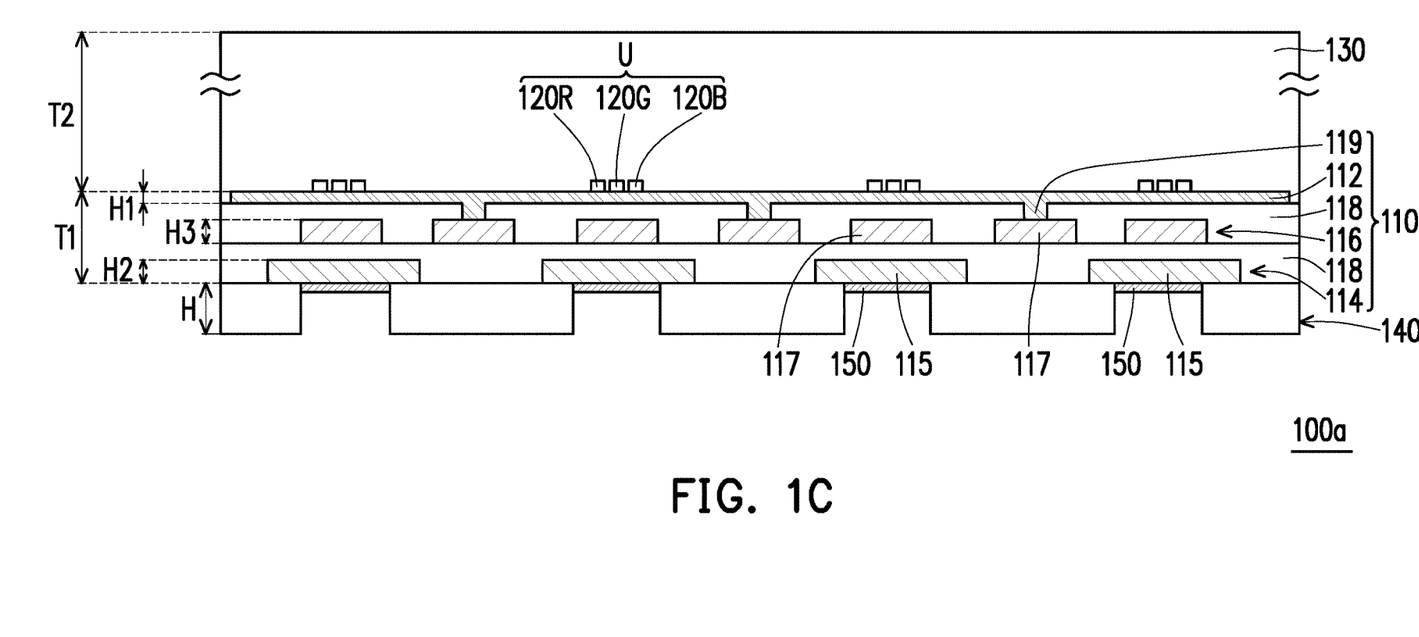
FIG. 1C is a schematic cross-sectional view of the micro LED display matrix module in FIG. 1A.

FIG. 1A is a top perspective schematic view of a micro light-emitting diode (LED) display matrix module according to an embodiment of the disclosure. FIG. 1B is an enlarged schematic view of a pixel region of the micro LED display matrix module in FIG. 1A. FIG. 1C is a schematic cross-sectional view of the micro LED display matrix module in FIG. 1A. Some layers and components have been omitted in FIG. 1A for clarity.

With reference to FIGS. 1A, 1B, and 1C simultaneously, in the embodiment, a micro LED display matrix module 100a includes a multilayer circuit layer 110, a plurality of micro LEDs 120R, 120G, and 120B, and an insulating flat layer 130. The multilayer circuit layer 110 includes a top circuit layer 112 and a bottom circuit layer 114. The bottom circuit layer 114 includes a plurality of pads 115 that are separated from each other. The micro LEDs 120R, 120G, and 120B are disposed on the top circuit layer 112 of the multilayer circuit layer 110 and define a plurality of light-emitting units U. Each of the light-emitting units U includes three micro LEDs 120R, 120G, and 120B that are separated from each other. Herein, the three micro LEDs 120R, 120G, and 120B in each of the light-emitting units U are a red micro LED, a green micro LED, and a blue micro LED, respectively. In particular, the light-emitting unit U may be arranged in a matrix of m columns and n rows to define a plurality of pixel regions P, and quantity of the pads 115 is equal to 3m+n, where m>2 and n>2. As shown in FIG. 1A, both m and n in the embodiment are 4, therefore there are 4*4=16 pixel regions P, and the quantity of the pads 115 is 3*4+4=16. In addition, in the embodiment, the orthographic projection of each of pads 115 completely overlaps the corresponding micro LEDs 120R, 120G, and 120B on the bottom circuit layer 114 to be with good flatness. The insulating flat layer 130 covers the top circuit layer 112 of the multilayer circuit layer 110 and the micro LEDs 120R, 120G, and 120B.

Furthermore, with reference to FIGS. 1A and 1C again, the multilayer circuit layer 110 of the embodiment further includes at least one internal circuit layer (schematically shown as a single internal circuit layer 116) and a plurality of dielectric layers (schematically shown as two dielectric layers 118). The internal circuit layer 116 is located between the top circuit layer 112 and the bottom circuit layer 114, and the dielectric layers 118 are located between the top circuit layer 112, the internal circuit layer 116, and the bottom circuit layer 114. In other words, the top circuit layer 112, the internal circuit layer 116, and the bottom circuit layer 114 are electrically isolated through the dielectric layers 118. A thickness H1 of the top circuit layer 112 is less than a thickness H3 of the internal circuit layer 116 and a thickness H2 of the bottom circuit layer 114. Preferably, the thickness H1 is ½ of the thickness H3 or ½ of the thickness H2.

In particular, a circuit pattern density by the top circuit layer 112 and the internal circuit layer 116 in each of the layers of the embodiment is at least greater than 50%, and preferably up to 80%, which makes each of the layers to be more even, so that to facilitate a subsequent flip-chip bonding process of the micro LEDs 120R, 120G, and 120B and improve the yield. In addition, taking into consideration the process limitations such as line width of exposure/etching, or parasitic capacitance generated between the layers, the circuit patterns density is preferably not more than 90%. Preferably, the circuit pattern density in the internal circuit layer 116 is greater than the circuit pattern density in the top circuit layer 112, and the circuit pattern density in the top circuit layer 112 is greater than circuit pattern density in the bottom circuit layer 114.

With reference to FIG. 1C, the multilayer circuit layer 110 of the embodiment further includes a plurality of conductive vias 119. The top circuit layer 112, the internal circuit layer 116, and the bottom circuit layer 114 are electrically connected through the conductive vias 119. That is, the top circuit layer 112 and the internal circuit layer 116 are electrically connected through the conductive vias 119, and the internal circuit layer 116 and the bottom circuit layer 114 are also electrically connected through the conductive vias 119. FIG. 1C only shows a cross-section, and only the top circuit layer 112 and the internal circuit layer 116 are electrically connected through the conductive vias 119 is seen. In another cross-section not shown, the internal circuit layer 116 and the bottom circuit layer 114 are also electrically connected through the conductive vias 119. In particular, orthographic projections of the conductive vias 119 on the bottom circuit layer 114 does not overlap the orthographic projections of the micro LEDs 120R, 120G, and 120B on the bottom circuit layer 114. In other words, in a plan view, none of the position of each of the micro LEDs 120R, 120G, and 120B overlaps the position of the conductive vias 119. Furthermore, the internal circuit layer 116 of the embodiment includes a plurality of circuit patterns 117. An orthographic projection of each of the light-emitting units U on the bottom circuit layer 114 completely overlaps the corresponding circuit pattern 117. Herein, the orthographic projection of each of the micro LEDs 120R, 120G, and 120B on the bottom circuit layer 114 completely overlaps the corresponding circuit pattern 117.

Furthermore, the insulating flat layer 130 of the embodiment is with high visible light transmittance and high Young's modulus. In detail, for example, the visible light transmittance of the insulating flat layer 130 is greater than 90%, and the Young's modulus is between 10 GPa and 50 GPa. Preferably, the Young's modulus is greater than 30 GPa. The material of the insulating flat layer 130 is, for example, UV-curable acrylate resin or poly methyl pentene (PMP). Preferably, a thickness T2 of the insulating flat layer 130 is at least 5 times greater than a thickness T1 of the multilayer circuit layer 110. For example, the thickness T2 of the insulating flat layer 130 is, for example, 100 to 150 μm, and the thickness T1 of the multilayer circuit layer 110 is, for example, 20 to 30 μm. Since the insulating flat layer 130 of the embodiment is a hard material, the micro LED display matrix module 100a may be picked up and bonded by a transfer device, such as an SMT device.

In addition, with reference to FIG. 1C again, the micro LED display matrix module 100a of the embodiment further includes an insulation layer 140. The insulation layer 140 is disposed on a side of the bottom circuit layer 114 opposite to the internal circuit layer 116, and a part of the pads 115 is exposed. Furthermore, the insulation layer 140 covers the surrounding surface and a part of a top surface of each of the pads 115, and exposes a middle part of the pads 115. Herein, a thickness H of the insulation layer 140 is greater than the thickness H2 of the bottom circuit layer 114. For example, the thickness H of the insulation layer 140 is 10 μm to 15 μm, but it is not limited thereto.

In addition, the micro LED display matrix module 100a of the embodiment further includes a surface treatment layer 150. The surface treatment layer 150 is disposed on the part of the top surface of the pads 115 exposed by the insulation layer 140. Preferably, the material of the surface treatment layer 150 is, for example, electroless nickel immersion gold (ENIG), which can effectively prevent or reduce oxidation of the pads 115 exposed by the insulation layer 140.

In order to effectively reduce the quantity of scraps, the embodiment also reserves at least one repair position for repair micro LEDs 120P in each of the pixel regions P (three repair positions are schematically shown in FIG. 1B). The repair micro LEDs 120P are separated from each other and their electrical connections are respectively the same as that of the micro LEDs 120R, 120G, and 120B, so as to allow replacement of the defective or damaged micro LEDs 120R, 120G, and 120B. Herein, the orthographic projection of each of the pads 115 completely overlaps the corresponding repair micro LED 120P on the bottom circuit layer 114. In other words, the repair micro LEDs 120P is not placed when the micro LEDs 120R, 120G, 120B are flawless or undamaged. The repair micro LEDs 120P are placed to replace the micro LEDs 120R, 120G, and 120B when the micro LEDs 120R, 120G, and 120B are defective or damaged, which can reduce the quantity of micro LED display matrix module 100a being scrapped.

In short, in the embodiment, the light-emitting unit U composed of three micro LEDs 120R, 120G, and 120B may be arranged in the matrix of m columns and n rows to define the pixel regions P, and the quantity of the pads 115 is equal to 3m+n. Compared with the related art in which each of the micro LED needs to be matched with two pads, in the embodiment, only 16 pads 115 are needed for the 48 micro LEDs 120R, 120G, and 120B in the 4*4 pixel regions P. The pads 115 may be larger in size and arranged more neatly through the circuit-to-layer design of the multilayer circuit layer 110. Therefore, the above design can effectively reduce the quantity of the pads 115 and improve the alignment accuracy when the micro LED display matrix module 100a is disposed on a display circuit board (not shown) in subsequent process, so as to make the yield better. Furthermore, the micro LED display matrix module 100a of the embodiment is not limited to active driving or passive driving, hence is more flexible in application. In addition, in the embodiment, the orthographic projection of each of the pads 115 completely overlaps the corresponding micro LEDs 120R, 120G, and 120B on the bottom circuit layer 114, which makes the micro LED display matrix module 100a more even so that is beneficial to mass transfer process of the micro LEDs 120R, 120G, and 120B, and to improve the bonding yield.

It must be noted here that the following embodiments continue to use the reference numerals and part of the content of the foregoing embodiments. The same reference numerals are used to represent the same or similar elements, and the description of the same technical content is omitted. Reference may be made to the foregoing embodiments for the description of the omitted parts, which will not be reiterated in the following embodiments.

Figure 2:
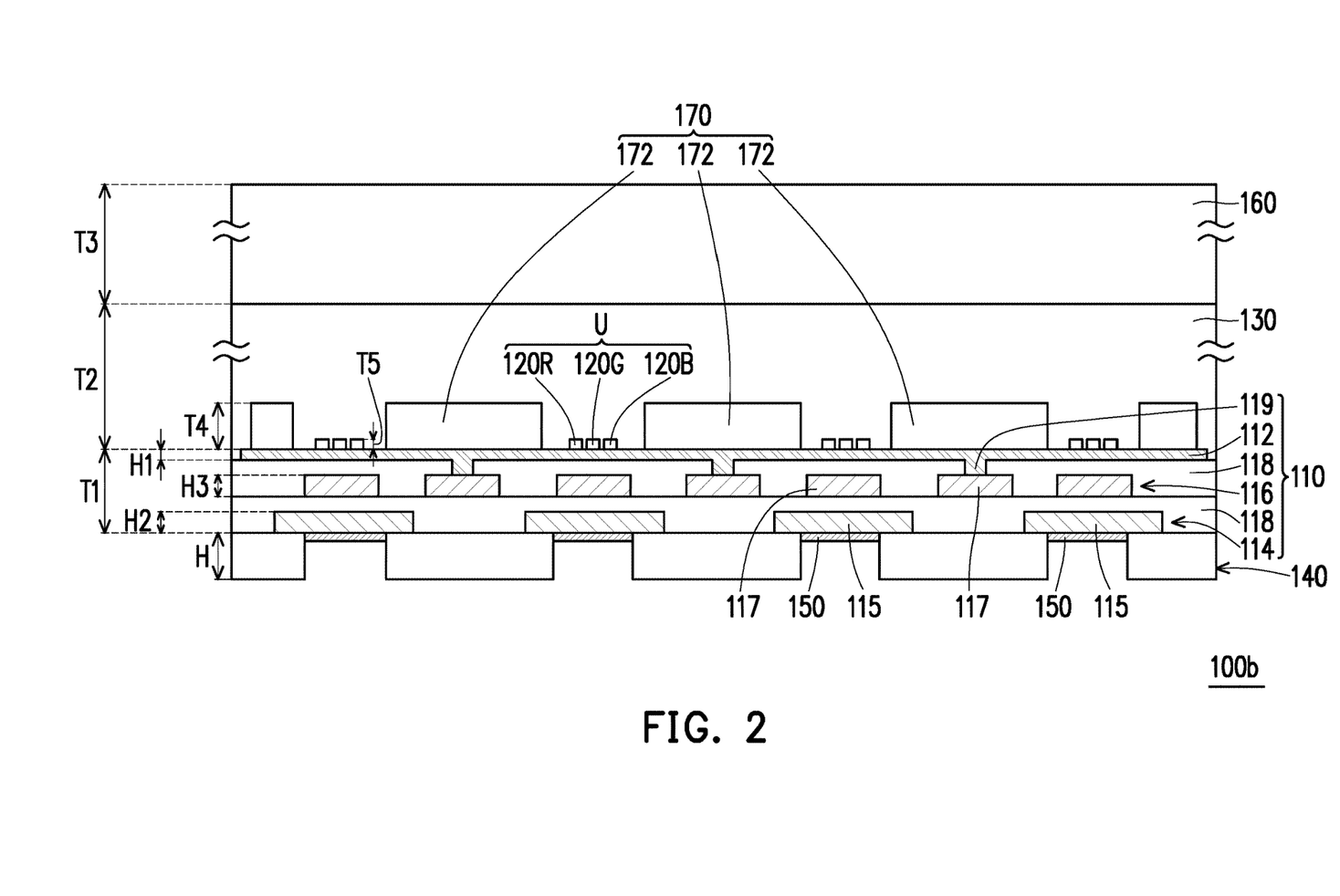
FIG. 2 is a schematic cross-sectional view of a micro LED display matrix module according to another embodiment of the disclosure.

FIG. 2 is a schematic cross-sectional view of a micro LED display matrix module according to another embodiment of the disclosure. With reference to FIG. 1C and FIG. 2 simultaneously, a micro LED display matrix module 100b of the embodiment is similar to the micro LED display matrix module 100a in FIG. 1C, except that in the embodiment, the micro LED display matrix module 100b also includes a hard substrate 160 disposed on the insulating flat layer 130. The insulating flat layer 130 is located between the hard substrate 160 and the multilayer circuit layer 110. Preferably, a thickness T3 of the hard substrate 160 is greater than the thickness T2 of the insulating flat layer 130. For example, the thickness T3 of the hard substrate 16 is 250 μm and the thickness T2 of the insulating flat layer 130 is 80 μm. In the embodiment, the insulating flat layer 130 is a highly transparent encapsulant, such as a b-stage silicon or epoxy resin, and has Young's modulus between 0.01 GPa and 2 GPa.

In addition, the embodiment also includes a light blocking layer 170, which is disposed on the top circuit layer 112 of the multilayer circuit layer 110 and includes a plurality of blocking portions 172. The blocking portions 172 and the light-emitting units U are in an alternate arrangement. Preferably, a thickness T4 of the light blocking layer 170 is greater than a thickness T5 of each of the micro LEDs 120. For example, the thickness T5 of the micro LED 120 is less than 10 μm, and the thickness T4 of the light blocking layer 170 is, for example, 15 μm to 30 μm.

In short, since the micro LED display matrix module 100b of the embodiment includes the hard substrate 160, the micro LED display matrix module 100b has a strong structural strength and may be picked up and bonded by the transfer device, such as the SMT device. In addition, the micro LED display matrix module 100b of the embodiment also includes the light blocking layer 170, which blocks reflection of metal circuit and brightness interference between the light-emitting units U, this provides the micro LED display matrix module 100b a good display effect.

Figure 3:
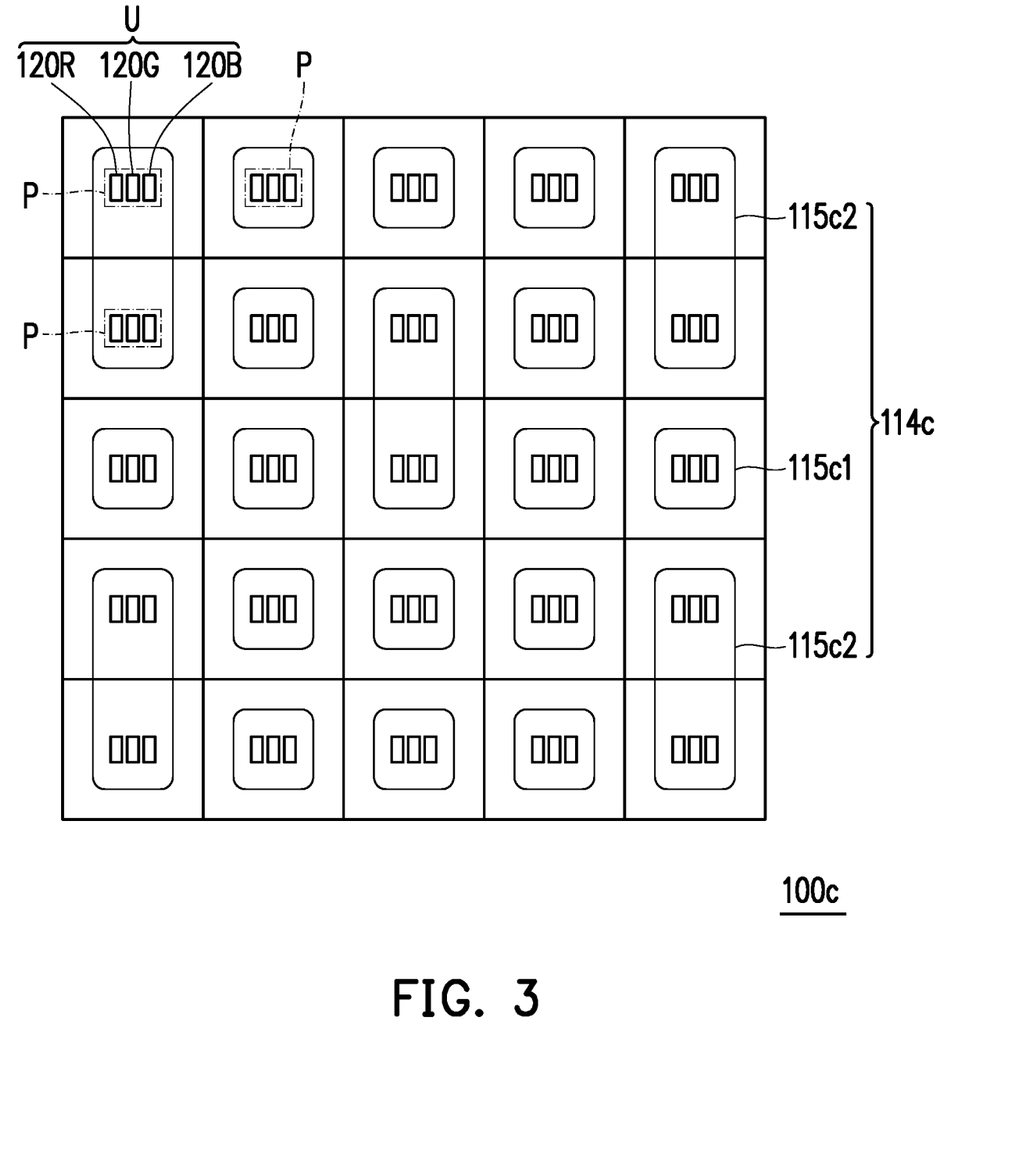
FIG. 3 is a schematic top view of a micro LED display matrix module according to yet another embodiment of the disclosure.

FIG. 3 is a schematic top view of a micro LED display matrix module according to yet another embodiment of the disclosure. For the convenience of description, some components are omitted in FIG. 3. With reference to FIGS. 1A and 3 simultaneously, a micro LED display matrix module 100c of the embodiment is similar to the micro LED display matrix module 100a in FIG. 1A, except that in the embodiment, the light-emitting units U may be arranged into a matrix of m columns and n rows, where m=5 and n=5. That is, in the embodiment, there are 5*5=25 pixel regions P, and the quantity of pads $115c1$ and $115c2$ of a bottom circuit layer $114c$ is 3*5+5=20. As shown in FIG. 3, a size of the pad $115c2$ of the embodiment is larger than a size of the pad $115c1$, and the pad $115c2$ spans two of the pixel regions P. The orthographic projection of the pad $115c2$ completely overlaps the two light-emitting units U located in the two pixel regions P on the bottom circuit layer 114.

In summary, in the design of the micro LED display matrix module of the disclosure, the light-emitting unit composed of the every three micro LED may be arranged in the matrix of m columns and n rows to define the plurality of pixel regions, and the quantity of the pads is equal to 3m+n. The orthographic projection of each of the pads completely overlaps the corresponding micro LEDs on the bottom circuit layer. In this way, the quantity of the pads can be effectively reduced, and the micro LED display matrix module can be with good surface flatness, thereby improving the process yield for being bonded to the display circuit board.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A micro light-emitting diode (LED) display matrix module, comprising:
    a multilayer circuit layer, comprising a top circuit layer and a bottom circuit layer, wherein the bottom circuit layer comprises a plurality of pads;
    a plurality of micro LEDs, disposed on the top circuit layer of the multilayer circuit layer, and defining a plurality of light-emitting units, wherein each of the plurality of light-emitting units comprises three of the plurality of micro LEDs that are separated from each other, and the plurality of light-emitting units are arranged in a matrix of m columns and n rows to define a plurality of pixel regions, wherein quantity of the plurality of pads is equal to 3m+n, and an orthographic projection of each of the plurality of pads completely overlaps the corresponding plurality of micro LEDs on the bottom circuit layer; and
    an insulating flat layer, covering the top circuit layer of the multilayer circuit layer and the plurality of micro LEDs.

2. The micro LED display matrix module according to claim 1, wherein the multilayer circuit layer further comprises at least one internal circuit layer and a plurality of dielectric layers, the at least one internal circuit layer is located between the top circuit layer and the bottom circuit layer, and the plurality of dielectric layers are located between the top circuit layer, the at least one internal circuit layer, and the bottom circuit layer.

3. The micro LED display matrix module according to claim 2, wherein a thickness of the top circuit layer is less than a thickness of the at least one internal circuit layer and a thickness of the bottom circuit layer.

4. The micro LED display matrix module according to claim 2, wherein a circuit pattern density in the at least one internal circuit layer is greater than a circuit pattern density in the top circuit layer, and the circuit pattern density in the top circuit layer is greater than a circuit pattern density in the bottom circuit layer.

5. The micro LED display matrix module according to claim 2, wherein the multilayer circuit layer further comprises a plurality of conductive vias, and the top circuit layer, the at least one internal circuit layer, and the bottom circuit layer are electrically connected through the plurality of conductive vias.

6. The micro LED display matrix module according to claim 5, wherein orthographic projections of the plurality of conductive vias on the bottom circuit layer do not overlap the orthographic projections of the plurality of micro LEDs on the bottom circuit layer.

7. The micro LED display matrix module according to claim 2, wherein the at least one internal circuit layer comprises a plurality of circuit patterns, and an orthographic projection of each of the plurality of light-emitting units on the bottom circuit layer completely overlaps the corresponding circuit patterns.

8. The micro LED display matrix module according to claim 1, wherein the Young's modulus of the insulating flat layer is between 10 GPa and 50 GPa.

9. The micro LED display matrix module according to claim 1, wherein a thickness of the insulating flat layer is at least 5 times greater than a thickness of the multilayer circuit layer.

10. The micro LED display matrix module according to claim 1, further comprising:
    a hard substrate, disposed on the insulating flat layer, wherein the insulating flat layer is located between the hard substrate and the multilayer circuit layer.

11. The micro LED display matrix module according to claim 10, wherein a thickness of the hard substrate is greater than a thickness of the insulating flat layer.

12. The micro LED display matrix module according to claim 1, further comprising:
    an insulation layer, disposed on a side of the bottom circuit layer opposite to the at least one internal circuit layer, and exposing a part of the plurality of pads.

13. The micro LED display matrix module according to claim 12, wherein the insulation layer covers a part of a top surface of the plurality of pads.

14. The micro LED display matrix module according to claim 13, further comprising:
    a surface treatment layer, disposed on the part of the top surface of the plurality of pads exposed by the insulation layer.

15. The micro LED display matrix module according to claim 14, wherein a material of the surface treatment layer comprises electroless nickel immersion gold (ENIG).

16. The micro LED display matrix module according to claim 12, wherein a thickness of the insulation layer is greater than a thickness of the bottom circuit layer.

17. The micro LED display matrix module according to claim 1, further comprising:
    a light blocking layer, disposed on the top circuit layer of the multilayer circuit layer, and comprising a plurality of blocking portions, wherein the plurality of blocking portions and the plurality of light-emitting units are in an alternate arrangement.

18. The micro LED display matrix module according to claim 17, wherein a thickness of the light blocking layer is greater than a thickness of each of the plurality of micro LEDs.

19. The micro LED display matrix module according to claim 1, wherein m>2 and n>2.

20. The micro LED display matrix module according to claim 1, wherein each of the plurality of light-emitting units further comprises at least one repair micro LED, and the orthographic projection of each of the plurality of pads completely overlaps the corresponding at least one repair micro LED on the bottom circuit layer.

* * * * *